US010721827B2

(12) United States Patent
Scarlata et al.

(10) Patent No.: US 10,721,827 B2
(45) Date of Patent: Jul. 21, 2020

(54) ILLUMINATED VIEWING SYSTEMS FOR ENCLOSURES

(71) Applicant: Cooper Technologies Company, Houston, TX (US)

(72) Inventors: Andrew Francis Scarlata, West Monroe, NY (US); Jesse Wade Taylor, Baldwinsville, NY (US); Joseph Michael Manahan, Manlius, NY (US); Adikaramge Asiri Jayawardena, Manlius, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 15/834,651

(22) Filed: Dec. 7, 2017

(65) Prior Publication Data

US 2018/0168054 A1    Jun. 14, 2018

Related U.S. Application Data

(60) Provisional application No. 62/431,525, filed on Dec. 8, 2016.

(51) Int. Cl.
| | |
|---|---|
| *H05K 5/00* | (2006.01) |
| *H05K 5/02* | (2006.01) |
| *F21V 23/04* | (2006.01) |
| *H01H 85/02* | (2006.01) |
| *G02B 7/02* | (2006.01) |

(Continued)

(52) U.S. Cl.
CPC .............. *H05K 5/0217* (2013.01); *F21S 9/02* (2013.01); *F21V 23/0471* (2013.01); *F21V 25/12* (2013.01); *G02B 7/02* (2013.01); *H01H 85/0241* (2013.01); *H02B 1/306* (2013.01);

(Continued)

(58) Field of Classification Search
USPC ........................................................ 362/125
See application file for complete search history.

(56) References Cited

U.S. PATENT DOCUMENTS

| 9,191,107 B2 | 11/2015 | Manahan | |
|---|---|---|---|
| 2004/0016186 A1 * | 1/2004 | Iarussi | ...................... E06B 7/28 52/173.1 |

(Continued)

FOREIGN PATENT DOCUMENTS

| DE | 3808716 A1 * | 9/1989 | ............ F24C 15/008 |
|---|---|---|---|
| GB | 2458372 | 9/2009 | |

OTHER PUBLICATIONS

Machine language translation of the above document DE-3808716-A1, dated Sep. 1989, to Piechowiak.*

(Continued)

*Primary Examiner* — Daniel A Hess
(74) *Attorney, Agent, or Firm* — King & Spalding LLP

(57) ABSTRACT

An enclosure disposed in an ambient environment can include at least one wall that forms a cavity. The enclosure can also include at least one electrical device disposed within the cavity. The enclosure can further include at least one illuminated viewing system disposed in the at least one wall. The at least one illuminated viewing system can include a window disposed in the at least one wall. The at least one illuminated viewing system can also include at least one light source assembly that directs light within the cavity in which the at least one electrical device is disposed.

19 Claims, 9 Drawing Sheets

(51) Int. Cl.
    *F21S 9/02*     (2006.01)
    *H02B 1/30*     (2006.01)
    *H05K 7/14*     (2006.01)
    *F21V 25/12*     (2006.01)
    *H01H 9/02*     (2006.01)

(52) U.S. Cl.
    CPC ........... *H05K 7/1432* (2013.01); *G02B 7/022* (2013.01); *H01H 2009/0292* (2013.01)

(56) References Cited

U.S. PATENT DOCUMENTS

| | | | |
|---|---|---|---|
| 2013/0100675 A1* | 4/2013 | Han | H01L 27/301 362/253 |
| 2015/0226414 A1 | 8/2015 | Manahan et al. | |
| 2016/0126029 A1 | 5/2016 | Faulkner et al. | |
| 2018/0073702 A1* | 3/2018 | Hartlove | F21V 9/30 |
| 2018/0079353 A1* | 3/2018 | Litke | B32B 17/10541 |

OTHER PUBLICATIONS

I. Istomin, International Search Report and Written Opinion issued in PCT/US2017065066, completion date Mar. 15, 2018, dated Apr. 5, 2018, 7 pages, Federal Institute of Industrial Property, Moscow, Russia.

Crounse-Hinds by Eaton, "Article 500-516 of the National Electrical Code with recommendation for use in hazardous (classified) areas", 2014 Code Digest Article 500 Hazardous (Classified) Locations, 128 pages.

NEMA Setting Standards for Excellence, "NEMA Enclosure Types", National Electrical Manufacturers Association, Nov. 2005, 9 pages.

* cited by examiner

ILLUMINATED VIEWING SYSTEMS FOR ENCLOSURES

CROSS-REFERENCE TO RELATED APPLICATIONS

This application claims priority under 35 U.S.C. § 119 to U.S. Provisional Patent Application Ser. No. 62/431,525, titled "Illuminated Window Systems For Enclosures" and filed on Dec. 8, 2016, the entire contents of which are hereby incorporated herein by reference.

TECHNICAL FIELD

The present disclosure relates generally to enclosures, and more particularly to systems, methods, and devices for enclosures with illuminated window systems.

BACKGROUND

Enclosures, such as electrical enclosures, are used in a number of applications (e.g., commercial, industrial, residential) and have a number of different shapes, sizes, and configurations. Sometimes, such enclosures contain one or more pieces of equipment or devices. Such equipment can be electrical, mechanical, electronic, electro-mechanical. At times, it is necessary to visually inspect the equipment within an enclosure. Opening and closing these enclosures can be time-consuming, can present electrical shock hazards, can require prior de-energization of the enclosure, can require declassification of a hazardous location environment, and/or can present any of a number of other obstacles. As a result, inspection of equipment within such enclosures can be difficult or even discouraged because of the extra time and work involved. Some enclosures can include a viewing window, but such viewing window can be difficult to look through and may not be positioned properly to allow certain equipment within the enclosure to be viewed.

SUMMARY

In general, in one aspect, the disclosure relates to an enclosure disposed in an ambient environment. The enclosure can include at least one wall that forms a cavity. The enclosure can also include at least one electrical device disposed within the cavity. The enclosure can further include at least one illuminated viewing system disposed in the at least one wall. The at least one illuminated viewing system of the enclosure can include a window disposed in the at least one wall, and at least one light source assembly that directs light within the cavity in which the at least one electrical device is disposed.

These and other aspects, objects, features, and embodiments will be apparent from the following description and the appended claims.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positions may be exaggerated to help visually convey such principles. In the drawings, reference numerals designate like or corresponding, but not necessarily identical, elements.

DETAILED DESCRIPTION

Figure 1:
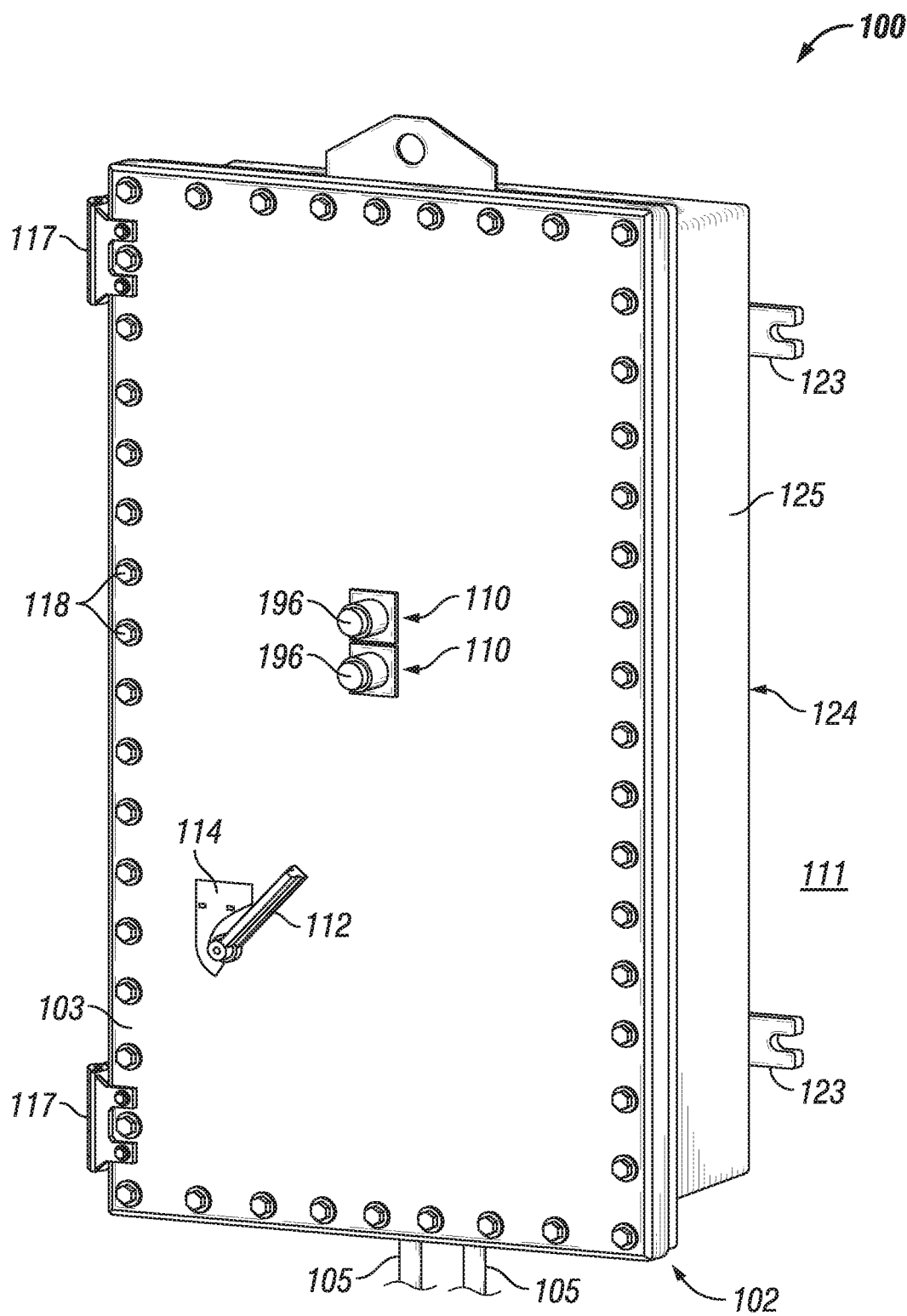
FIGS. 1 and 2 show an enclosure currently known in the art.

In general, example embodiments provide systems, methods, and devices for enclosures with illuminated window systems. While many of the example enclosures with illuminated window systems described herein are located in hazardous (e.g., explosive) environments, such enclosures can be located in other environments that are not considered hazardous. A user may be any person that interacts with enclosures. Examples of a user may include, but are not limited to, an engineer, an electrician, an instrumentation and controls technician, a mechanic, an operator, a consultant, a contractor, and a manufacturer's representative.

The example illuminated window systems described herein can be used as a new system for enclosures that do not have windows, as a retrofit system for enclosures that have windows that are not illuminated, and/or for entries that can be fitted with windows. The illuminated window systems for enclosures (or components thereof) described herein can be made of one or more of a number of suitable materials to allow the enclosures to meet certain standards and/or regulations while also maintaining durability in light of the one or more conditions under which the enclosures, including the example illuminated window systems, can be exposed. Examples of such materials can include, but are not limited to, aluminum, stainless steel, fiberglass, glass, plastic, ceramic, and rubber.

Example illuminated window systems for enclosures, or portions thereof, described herein can be made from multiple pieces that are mechanically coupled to each other. In such a case, the multiple pieces can be mechanically coupled to each other using one or more of a number of coupling methods, including but not limited to epoxy, welding, fastening devices, compression fittings, mating threads, and slotted fittings. One or more pieces that are mechanically coupled to each other can be coupled to each other in one or more of a number of ways, including but not limited to fixedly, hingedly, removeably, slidably, and threadably.

Components and/or features described herein can include elements that are described as coupling, mounting, fastening, securing, or other similar terms. Such terms are merely meant to distinguish various elements and/or features within a component or device and are not meant to limit the capability or function of that particular element and/or feature. For example, a feature described as a "coupling feature" can couple, mount, secure, fasten, abut against, and/or perform other functions aside from merely coupling.

A coupling feature (including a complementary coupling feature) as described herein can allow one or more components and/or portions of an example illuminated window to become mechanically coupled, directly or indirectly, to another portion of the illuminated window and/or an enclosure. A coupling feature can include, but is not limited to, a portion of a hinge, an aperture, a recessed area, a protrusion, a clamp, a slot, a spring clip, a tab, a detent, and mating threads. One portion of an enclosure can be coupled to a component of an example illuminated window systems by the direct use of one or more coupling features.

In addition, or in the alternative, a portion of an example illuminated window can be coupled to a component of an enclosure using one or more independent devices that interact with one or more coupling features disposed on a component of the illuminated window or other component of the enclosure. Examples of such devices can include, but are not limited to, a pin, a hinge, a fastening device (e.g., a bolt, a screw, a rivet), a clamp, and a spring. One coupling feature described herein can be the same as, or different than, one or more other coupling features described herein. A complementary coupling feature as described herein can be a coupling feature that mechanically couples, directly or indirectly, with another coupling feature.

Further, if a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three or four digit number and corresponding components in other figures have the identical last two digits.

In addition, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein.

In the foregoing figures showing example embodiments of illuminated window systems for enclosures, one or more of the components shown may be omitted, repeated, and/or substituted. Accordingly, example embodiments of illuminated window systems for enclosures should not be considered limited to the specific arrangements of components shown in any of the figures. For example, features shown in one or more figures or described with respect to one embodiment can be applied to another embodiment associated with a different figure or description. As a specific example, a sensor device can be used in an example embodiment described below, even though no sensor device is shown or described for that particular embodiment.

As defined herein, an enclosure is any type of cabinet or housing inside of which is disposed one or more devices (e.g., mechanical devices, electrical devices, electronic devices, electromechanical devices). Examples of such devices can include, but are not limited to, variable frequency drives (VFDs), controllers, relays (e.g., solid state, electro-mechanical), contactors, circuit breakers, switches, transformers, inverters, converters, fuses, electrical cables, thermo-electric coolers (TECs), enclosure walls, heating elements, air moving devices (e.g., fans, blowers), terminal blocks, motor stators, wire nuts, and electrical conductors. Examples of an enclosure can include, but are not limited to, an electrical connector, a junction box, a motor control center, a breaker cabinet, an electrical housing, a conduit, a control panel, an electrical receptacle, a lighting panel, a lighting device, a motor housing, a relay cabinet, an indicating panel, and a control cabinet.

For purposes of clarification, the enclosures described herein house at least one electrical device and are used in commercial or industrial processes. As a result, certain devices that might, in a very general and broad sense, be considered an "enclosure" would not be considered an enclosure for purposes of example embodiments described herein. Examples of such devices that are not considered an enclosure as applied for use with example embodiments described herein can include, but are not limited to, a display cabinet, a china hutch, a trophy case, a bulletin board case, a refrigerator, a freezer, a toaster oven, a conventional oven, and a microwave oven.

While all of these examples may include an electrical device, those electrical devices are housed in a separate compartment for the purpose of operating the device itself. For example, a refrigerator has a compressor, housed in a separate space from where food is stored, that runs to operate the refrigerator. Generally speaking, all of the enclosures with which example embodiments can be used have disposed therein at least one electrical device that is used to operate some other device, component, or process that is external to the enclosure.

Example embodiments are designed to provide illumination within an enclosure so that one or more devices disposed within the enclosure can be viewed through a window in a wall of the enclosure. In this way, the one or more devices can be viewed by a user without the user having to open the enclosure. Further, a user can inspect the interior of the enclosure for signs of corrosion, moisture accumulation, and other conditions that require maintenance. In addition, example embodiments can be used to verify the position and/or operation of a device within the enclosure. For example, example embodiments can be used to allow a user to verify the position of a contactor inside an enclosure, to verify that the blades of a switch (located inside an enclosure) have disengaged with the movement of the switch handle mounted in the door of the enclosure, or to verify whether a fuse located inside an enclosure has blown. Example embodiments can operate continuously, at regular intervals, on-demand (e.g., as a user approaches an example window of an enclosure), and/or according to some other schedule.

In certain example embodiments, enclosures with which example illuminated window systems are integrated are subject to meeting certain standards and/or requirements. For example, the National Electric Code (NEC), the National Electrical Manufacturers Association (NEMA), the International Electrotechnical Commission (IEC), and the Institute of Electrical and Electronics Engineers (IEEE) set standards as to electrical enclosures, wiring, and electrical connections. Enclosures that include example illuminated window systems described herein meet such standards when required. In some (e.g., PV solar) applications, additional standards particular to that application may be met by the enclosures with which example illuminated window systems are integrated.

For example, the example illuminated window systems, when integrated with an electrical enclosure, can allow the electrical enclosure to meet the NEMA 4X standard. In such a case, the electrical enclosure is constructed to provide a degree of protection to components (e.g., devices) disposed within the electrical enclosure against, at least, corrosion, falling dirt, rain, sleet, snow, ice, windblown dust, splashing water, and hose-directed water. As a specific example, an electrical enclosure with a NEMA 4X rating can provide protection with respect to harmful effects on equipment disposed within the electrical enclosure due to ingress of water. Thus, an example illuminated window that is mechanically coupled to such an electrical enclosure must also meet these standards.

An enclosure that includes an example illuminated window can be located in any type of environment (e.g., indoors, outdoors, under water, in a climate controlled room). In addition, or in the alternative, enclosures with an example illuminated window can be located in hazardous and/or marine environments. As defined herein, a hazardous location is any location where the enclosure can be exposed to extreme conditions. Extreme conditions can include, but are not limited to, high temperatures, low temperatures, temperature fluctuations, corrosion, humidity, chemicals, chemical vapors, vibrations, and dust. More information about hazardous locations and hazardous location enclosures can be found, for example, in Articles 500-506 and Articles 510-517 of the National Electric Code, which is incorporated herein by reference.

Examples of a hazardous location in which example embodiments can be used can include, but are not limited to, an airplane hangar, a drilling rig (as for oil, gas, or water), a production rig (as for oil or gas), a refinery, a chemical plant, a power plant, a mining operation, and a steel mill. A hazardous environment can include an explosive environment, which would require an enclosure with an example illuminated window to meet one or more requirements, including but not limited to maintaining flame paths.

An explosion-proof enclosure is a type of hazardous location electrical enclosure. In one or more example embodiments, an explosion-proof enclosure (also known as a flame-proof enclosure) is an electrical enclosure that is configured to contain an explosion that originates inside the enclosure. Further, the explosion-proof enclosure is configured to allow gases from inside the explosion-proof enclosure to escape across joints (also called gaps herein) of the explosion-proof enclosure and cool as the gases exit the explosion-proof enclosure. The joints are also known as flame paths and exist where two surfaces meet and provide a path, from inside the explosion-proof enclosure to outside the explosion-proof enclosure, along which one or more gases may travel. A joint may be a mating of any two or more surfaces. Each surface may be any type of surface, including but not limited to a flat surface, a threaded surface, and a serrated surface.

In one or more example embodiments, an explosion-proof enclosure is subject to meeting certain standards and/or requirements. For example, NEMA sets standards with which an electrical enclosure must comply in order to qualify as an explosion-proof enclosure. Specifically, NEMA Type 7, Type 8, Type 9, and Type 10 enclosures set standards with which an explosion-proof enclosure within certain hazardous locations must comply. For example, a NEMA Type 7 standard applies to electrical enclosures constructed for indoor use in certain hazardous locations. Hazardous locations may be defined by one or more of a number of authorities, including but not limited to the National Electric Code (e.g., Class 1, Division I) and UL (e.g., UL 1203). For example, a Class 1 hazardous area under the National Electric Code is an area in which flammable gases or vapors may be present in the air in sufficient quantities to be explosive.

As a specific example, NEMA standards for an explosion-proof enclosure of a certain size or range of sizes (e.g., greater than 100 $in^3$) may require that in a Group B, Division 1 area, any flame path of an explosion-proof enclosure must be at least 1 inch long (continuous and without interruption), and the gap between the surfaces cannot exceed 0.0015 inches. Standards created and maintained by NEMA may be found at www.nema.org/stds and are hereby incorporated by reference.

Example embodiments of illuminated window systems for enclosures will be described more fully hereinafter with reference to the accompanying drawings, in which example embodiments of illuminated window systems for enclosures are shown. Illuminated window systems for enclosures may, however, be embodied in many different forms and should not be construed as limited to the example embodiments set forth herein. Rather, these example embodiments are provided so that this disclosure will be thorough and complete, and will fully convey the scope of illuminated window systems for enclosures to those of ordinary skill in the art. Like, but not necessarily the same, elements (also sometimes called components) in the various figures are denoted by like reference numerals for consistency.

Terms such as "first", "second", "top", "bottom", "side", "width", "length", "within", "inner", and "outer" are used merely to distinguish one component (or part of a component or state of a component) from another. Such terms are not meant to denote a preference or a particular orientation, and are not meant to limit embodiments of illuminated window systems for enclosures. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 2:
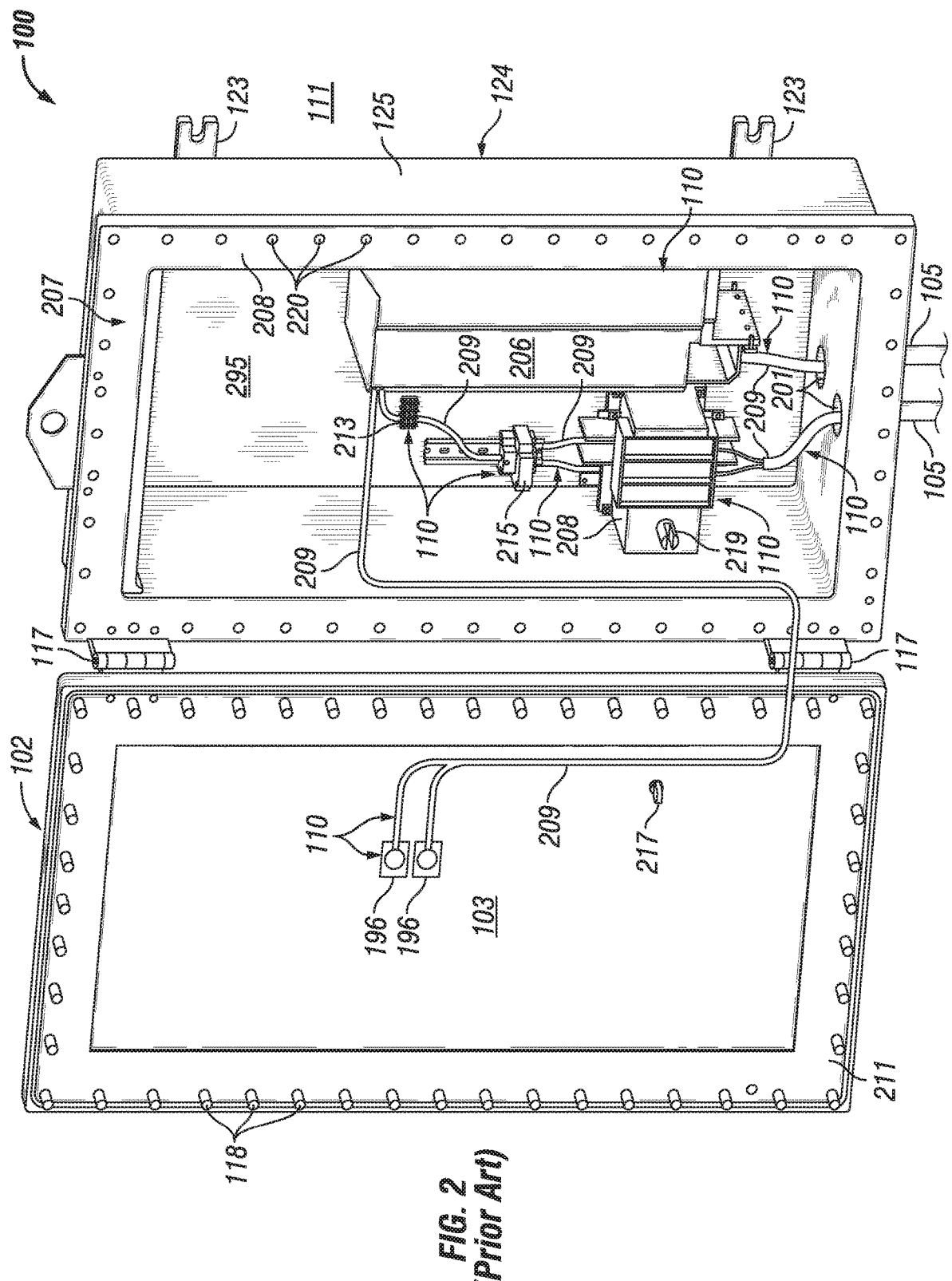

FIGS. 1 and 2 show an explosion-proof enclosure 100 (a specific type of enclosure) currently known in the art. Referring now to FIGS. 1 and 2, the explosion-proof enclosure 100 is shown in a closed position in FIG. 1 and an open position in FIG. 2. The enclosure 100 is disposed in an ambient environment 111 (e.g., a hazardous environment). In the closed position, the enclosure cover 102 is secured to the enclosure body 124. The enclosure body 124 has at least one wall 125 that forms a cavity 207. In addition, the enclosure cover 102 has at least one wall 103. There are a number of devices 110 (e.g., indicating lights 196, electrical conductors 209, a variable frequency drive (VFD) 206, a switch 288, a relay 215, a terminal block 213) disposed on a wall (e.g., wall 125, wall 103) and/or disposed within the cavity 207 of the enclosure 100.

At least one of the devices 110 within the cavity 207 of the enclosure 100 is an electrical device. An electrical device is any device that uses electricity to operate. Examples of an electrical device can include, but are not limited to, a VFD, a relay, a motor, a controller, a contactor, a transformer, an inductor, a resistor, a fuse, an inverter, a switch, a breaker, and an indicating light. Example embodiments described herein are used to allow a user to view inside an enclosure (e.g., enclosure 100) that contains at least one electrical device.

The enclosure cover 102 can be secured to the enclosure body 124 by a number of fastening devices 118 located at a number of points around the perimeter of the enclosure cover 102. In one or more example embodiments, a fastening device 118 may be one or more of a number of fastening devices, including but not limited to a bolt (which may be coupled with a nut), a screw (which may be coupled with a nut), and a clamp. In addition, one or more optional hinges 117 can be secured to one side of the enclosure cover 102 and a corresponding side of the enclosure body 124 so that, when all of the fastening devices 118 are removed, the enclosure cover 102 may swing outward (i.e., an open position) from the enclosure body 124 using the one or more hinges 117. In one or more example embodiments, there are no hinges, and the enclosure cover 102 can be completely separated from the enclosure body 124 when all of the fastening devices 118 are removed.

The enclosure cover 102 and the enclosure body 124 may be made of any suitable material, including metal (e.g., alloy, stainless steel), plastic, some other material, or any combination thereof. The enclosure cover 102 and the enclosure body 124 may be made of the same material or different materials. In one or more example embodiments, on the end of the enclosure body 124 opposite the enclosure cover 102, one or more mounting brackets 123 are affixed to the exterior of the enclosure body 124 to facilitate mounting the enclosure 100. Using the mounting brackets 123, the enclosure 100 may be mounted to one or more of a number of surfaces and/or elements, including but not limited to a wall, a control cabinet, a cement block, an I-beam, and a U-bracket.

The enclosure cover 102 includes at least one wall 103 that can optionally include one or more features that allow for user interaction while the enclosure 100 is sealed in the closed position. As shown in FIG. 1, one or more devices 110 (e.g., indicating lights 196) may be located (disposed) on the wall 103 of the enclosure cover 102. The wall 103 of the enclosure cover 102 may also include (have disposed therein) a switch handle 112 (a type of mechanical device, which can be considered a device 110 because the switch handle 112 is coupled to an electrical device 110, as discussed below) that allows a user to operate a switch (shown in FIG. 2 below) located inside the explosion-proof enclosure 100 while the explosion-proof enclosure 110 is closed. Each position (e.g., OFF, ON, HOLD, RESET) of the switch may be indicated by a switch position indicator 114 positioned adjacent to the switch handle 112 on the outer surface of the wall 103 of the enclosure cover 102. A switch associated with the switch handle 112 and the switch position indicator 114 may be used to electrically and/or mechanically isolate, and/or change the mode of operation of, one or more components inside or associated with the explosion-proof enclosure 100.

There can be one or more conduits 105 that are coupled to a wall 125 of the body 124 of the explosion-proof enclosure 100. Each conduit 105 can have one or more electrical conductors (e.g., electrical cables) disposed therein, where one end of the electrical conductors are electrically coupled to one or more electrical devices 110 disposed within the explosion-proof enclosure 100, as shown below with respect to FIG. 2.

FIG. 2 shows a front perspective view of an example of the interior of the explosion-proof enclosure 100 of FIG. 1. Referring to FIGS. 1 and 2, the explosion-proof enclosure 100 is in the open position because the enclosure cover 102 is not secured to the enclosure body 124. The hinges 117 attached to the left side of the enclosure body 124 are also attached to the left side of the enclosure cover 102, which is swung outward from the enclosure body 124. Because the explosion-proof enclosure 100 is in the open position, the components of the explosion-proof enclosure 100 are visible to a user.

As described above with respect to FIG. 1, the enclosure body 124 includes two or more mounting brackets 123. In addition, in one or more example embodiments, the enclosure body 124 includes an enclosure engagement surface 208 (also called a flange), against which an enclosure engagement surface 211 (also called a flange) of the enclosure cover 102 abuts against when the explosion-proof enclosure 100 is in the closed position. A number of coupling features 220 (in this case, apertures) are shown around the enclosure engagement surface 208, where each of the coupling features 220 are configured to receive a coupling feature 118 (in this case, a fastening device, such as a bolt) that traverses through corresponding coupling features (e.g., apertures) in the enclosure cover 102.

In one or more example embodiments, the explosion-proof enclosure 100 of FIG. 2 includes a mounting plate 295 that is affixed to the back of the inside of the explosion-proof enclosure 100. The mounting plate 295 may be configured to receive one or more components (e.g., electrical devices 110, mechanical devices) such that the one or more components are affixed to the mounting plate 295. The mounting plate 295 may include one or more apertures configured to receive coupling features (e.g., bolts) that may be used to affix a component to the mounting plate 295. The mounting plate 295 may be made of any suitable material, including but not limited to the material of the enclosure body 124. In one or more example embodiments, some or all of the one or more components may be mounted directly to an inside wall of the explosion-proof enclosure 100 rather than to the mounting plate 295.

In this case, the electrical devices 110 mounted to the mounting plate 295 within the cavity 207 of the explosion-proof enclosure 100 include a VFD 206, a switch 288, a relay 215, and a terminal block 213. The switch 288 can include a switch coupling 219 that couples to a switch handle shaft 217 that extends from the switch handle 112 when the explosion-proof enclosure is in the closed position. Electrical conductors 209 are used to electrically couple one electrical device 110 to at least one other electrical device 110 within the cavity 207 of the explosion-proof enclosure 100. Each conduit 105 is disposed within an entry hole 201 disposed in the bottom wall 125 of the enclosure body 124 of the explosion-proof enclosure 100.

Figure 3:
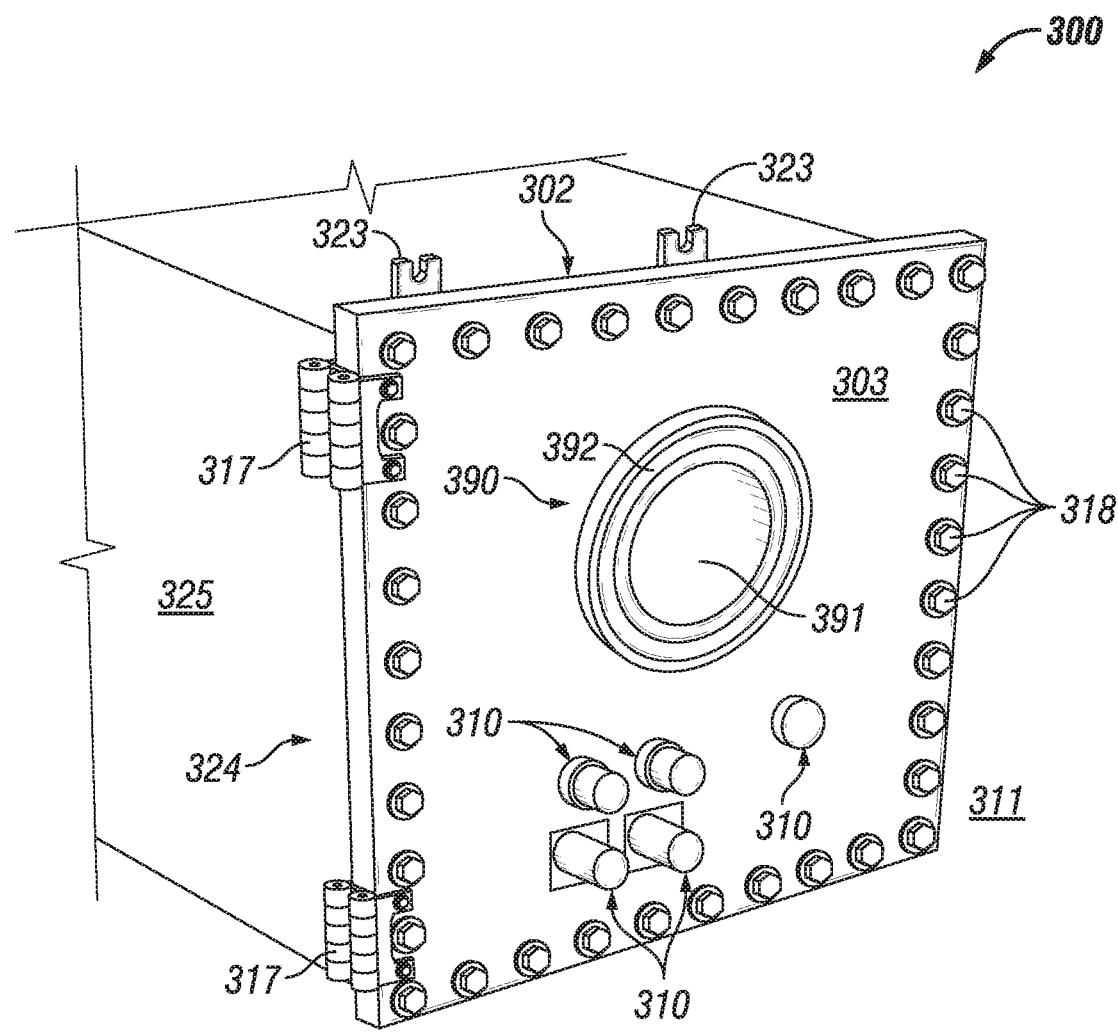
FIG. 3 shows an enclosure with a window currently known in the art.

FIG. 3 shows an example of an enclosure 300 with a window 390 currently known in the art. Referring to FIGS. 1-3, the enclosure 300 of FIG. 3 has a number of features that are substantially similar to corresponding features of the enclosure 100 of FIGS. 1 and 2. For example, the enclosure 300 of FIG. 3 includes a number of mounting brackets 323 disposed on the enclosure body 324, a number of hinges 317 coupled to a wall 325 of the enclosure body 324 and that hingedly couple the enclosure cover 302 to the enclosure body 324, and a number of devices 310 (in this case, indicating lights, switches, and pushbuttons) mounted on the wall 303 of the enclosure cover 302.

The enclosure 300 of FIG. 3 is shown in the closed position, with the enclosure cover 302 secured to the enclosure body 324 using a number of fastening devices 318. The viewing window 390 of the enclosure 300 in this case is disposed in an aperture that traverses the wall 303 of the enclosure cover 302. The window 390 in this case includes a lens 391 that is secured within an aperture in the wall 303 of the enclosure cover 302 using a frame 392. The lens 391 in this case is circular in shape when viewed from the front of the enclosure 300.

While the lens 391 can provide a view of the cavity of the enclosure 300 to a user while the enclosure 300 is in the closed position, there are often problems presented to a user when this occurs. The enclosure 300 often does not have any sources of light within the cavity, and even if sources of light (e.g., indicating lights) do exist, they do not generate enough lumens to allow a user to see through the lens 391 into the cavity of the enclosure 300.

As a result, a user often uses a source of light (e.g., a flashlight) external to the enclosure 300. This solution also poses a number of problems that prevents the user from viewing the devices within the cavity of the enclosure 300. The lens 391 of the window 390 is often thick and/or made of a material has some degree of opaqueness. As a result, directing a light source assembly from the ambient environment 311 (outside the enclosure 300) through the lens 391 often results in much of the light generated by the light source assembly being reflected back from the lens 391. In addition, a flashlight or other light source used in a hazardous environment needs to be explosion-proof, which adds to the size and weight of the flashlight or other light source, making the flashlight or other light source difficult to handle and operate.

In other words, without having a light source assembly within the lens (e.g., lens 391) of a window (e.g., window 390) and/or within the cavity of an enclosure (e.g., enclosure 300), a user often cannot view devices within the cavity through the lens of the window in enclosures currently known in the art. Examples of other enclosures having windows currently known in the art can be found in U.S. Provisional Patent Application No. 62/349,512, entitled "Visual Arrangements In Sealing Fittings For Conduit Systems; Enclosures; and Methods", the entire contents of which are hereby incorporated herein.

Figure 4:
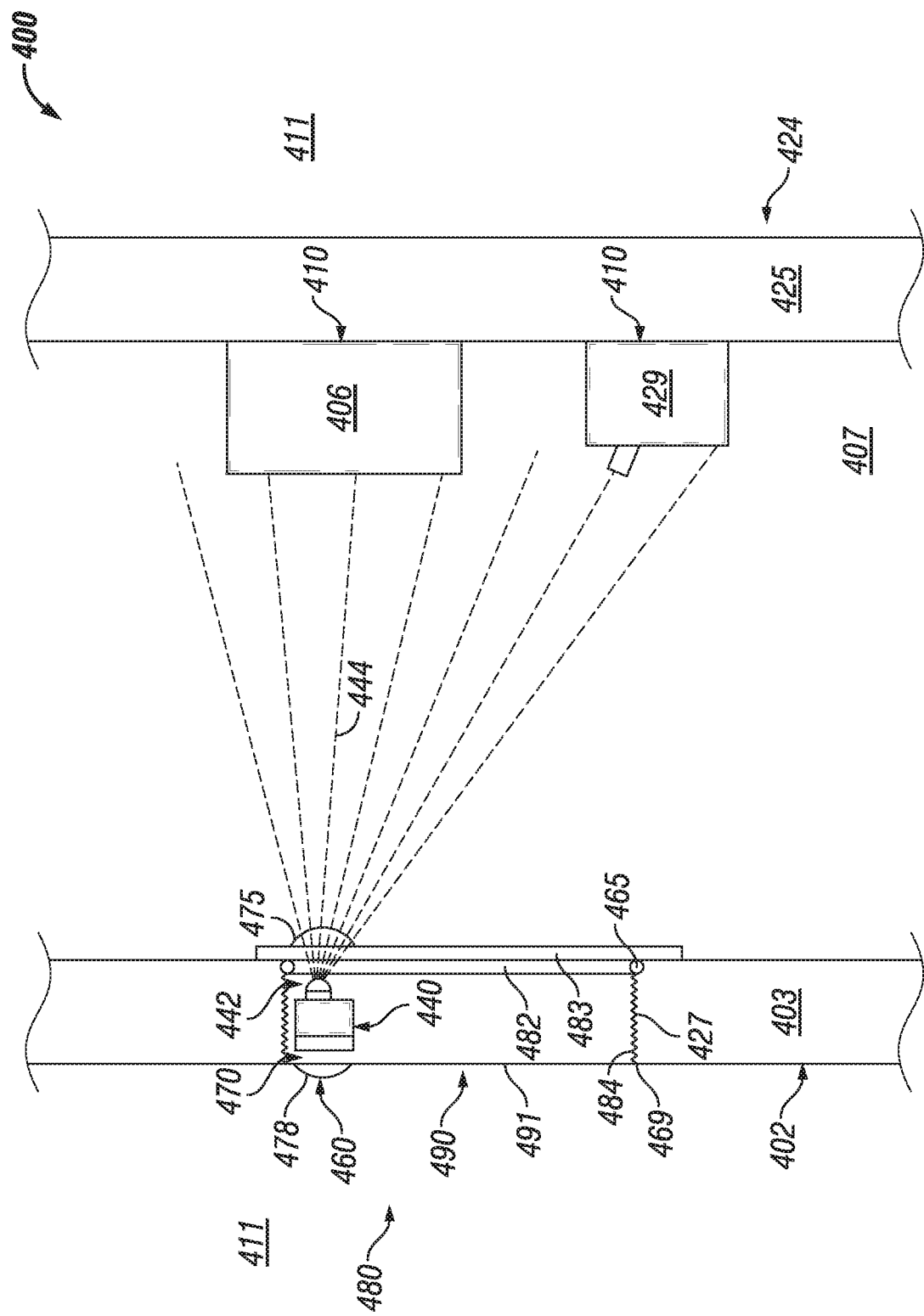
FIGS. 4-8 show enclosures with an illuminated window in accordance with certain example embodiments.
Figure 5:
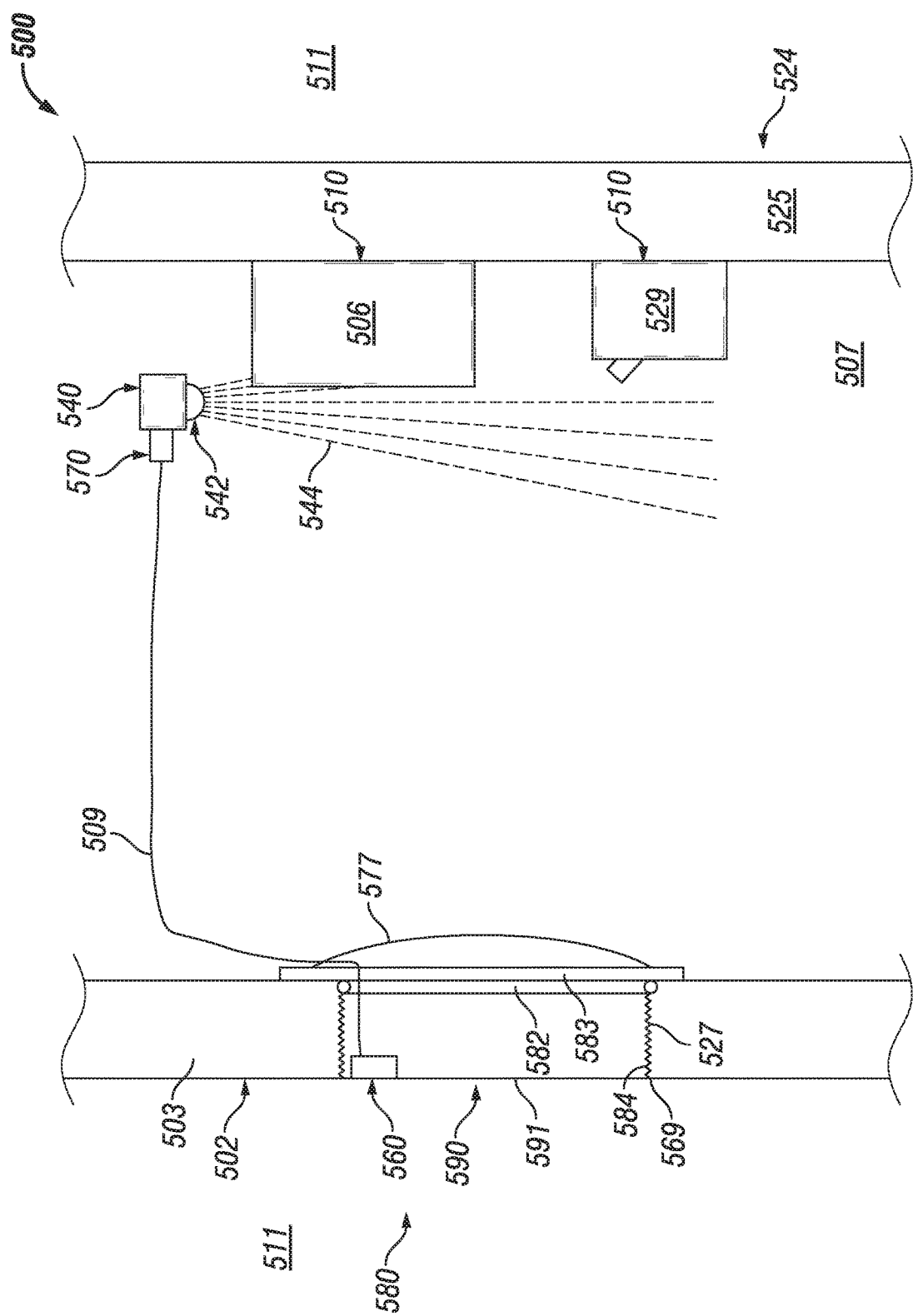
Figure 6:
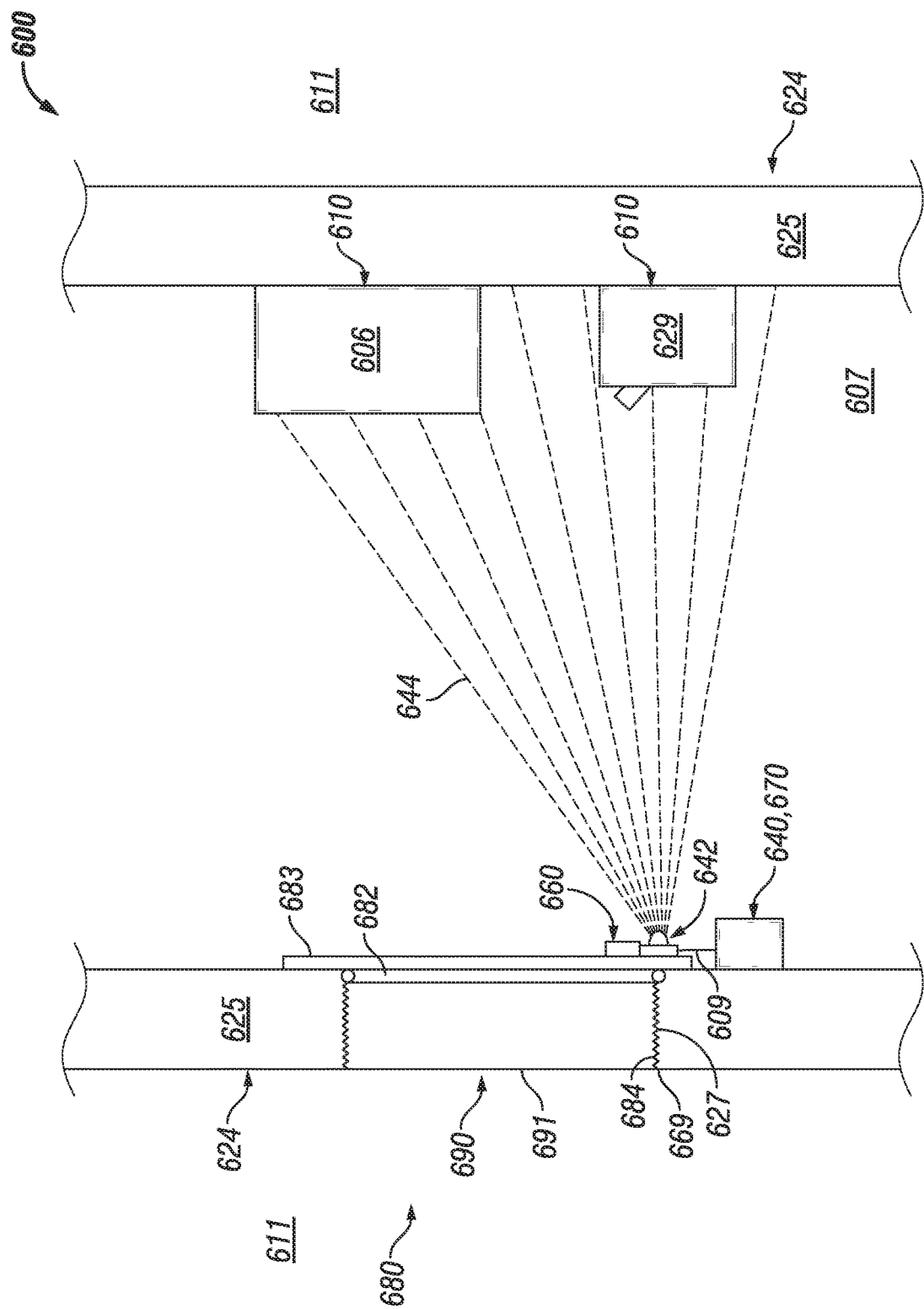
Figure 7:
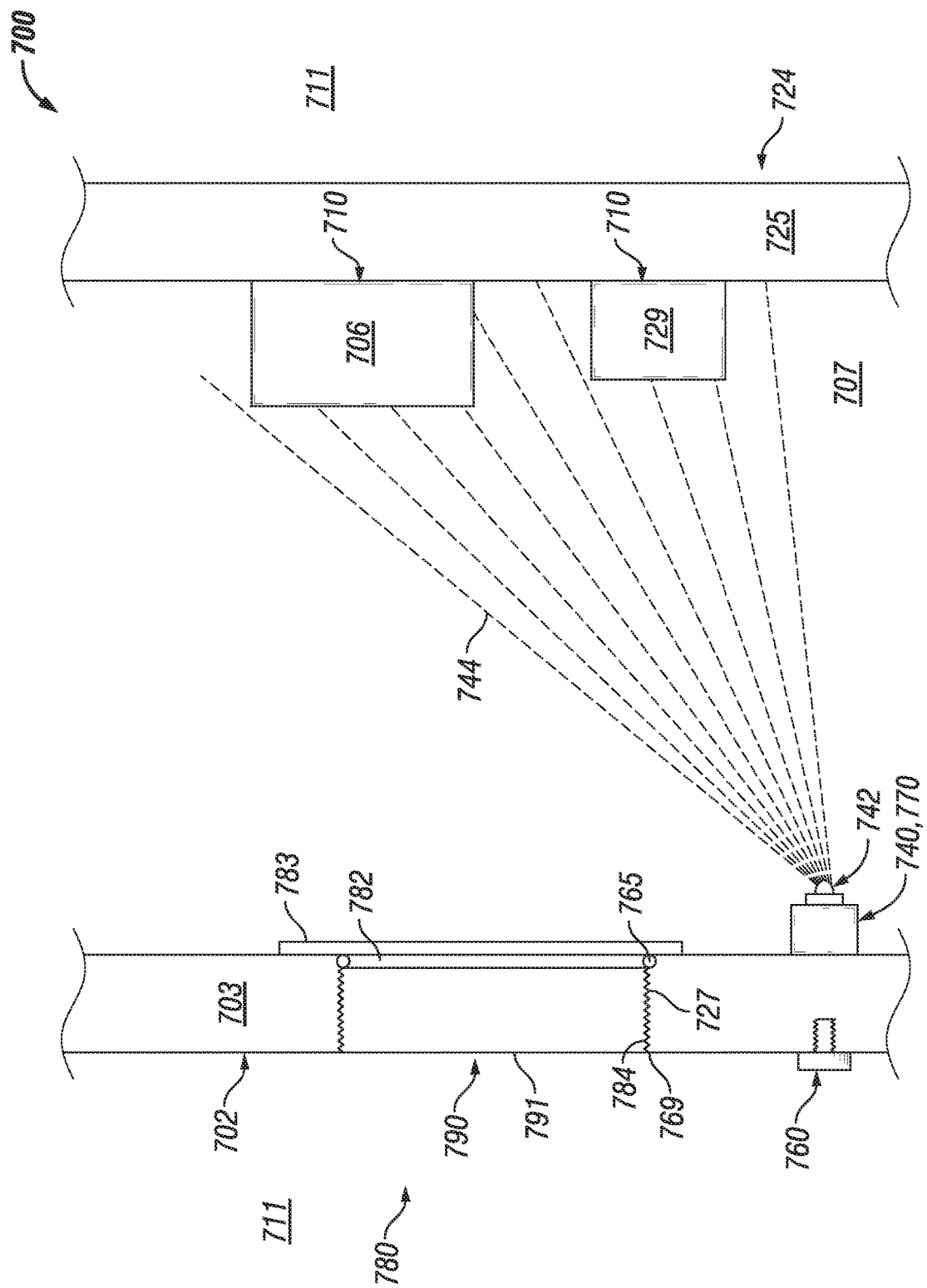
Figure 8:
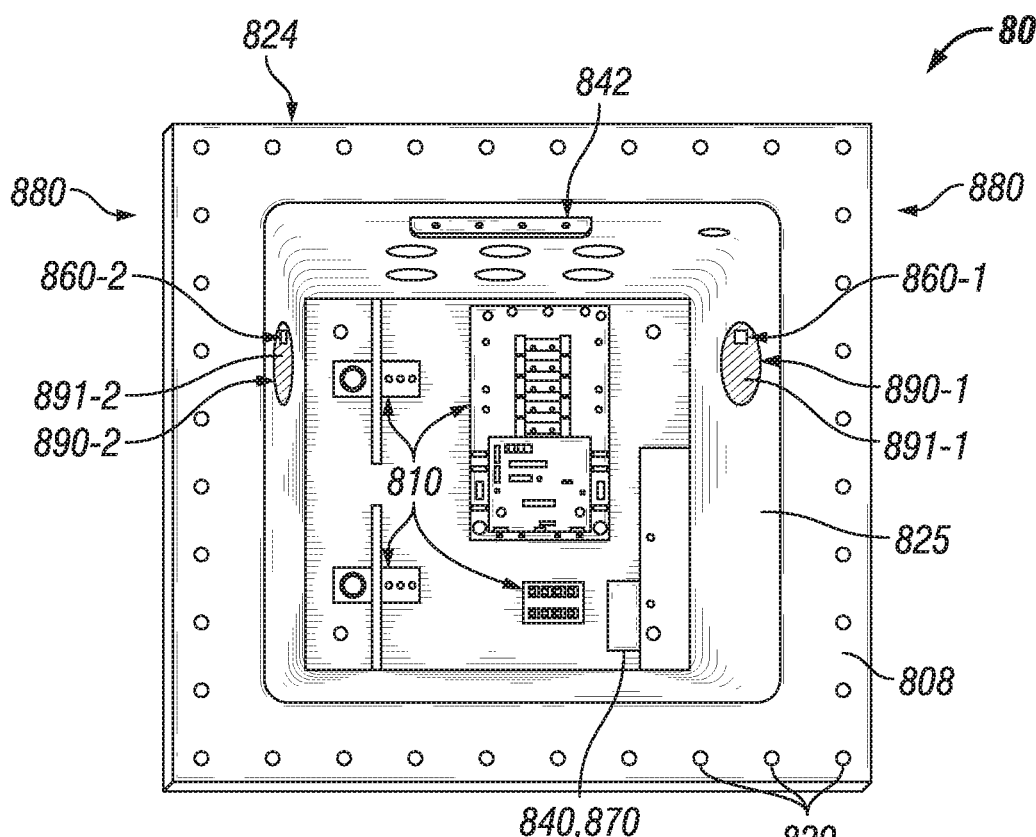

FIGS. 4-8 show enclosures with illuminated window systems in accordance with certain example embodiments. Specifically, FIG. 4 shows a partial cross-sectional side view of an enclosure 400 with an example illuminated viewing system 480. FIG. 5 shows a partial cross-sectional side view of an enclosure 500 with an example illuminated viewing system 580. FIG. 6 shows a partial cross-sectional front view of an enclosure 600 with an example illuminated viewing system 680. FIG. 7 shows a partial cross-sectional side view of an enclosure 700 with an example illuminated viewing system 780. FIG. 8 shows a front view of an open enclosure 800 (with the cover detached from the enclosure body 824) with an example illuminated viewing system 880.

Example illuminated window systems can include one or more of a number of features, including but not limited to a lens, a sealing member, a light source assembly, a power source, a switch, a sensor, and an optical feature. Referring to FIGS. 1-8, the example illuminated viewing system 480 of the enclosure 400 of FIG. 4 includes a window 490 disposed within an aperture in the wall 403 of the enclosure cover 402, as was the case in the example shown in FIG. 3 above.

In this example, the window 490 includes a lens 491, a transition layer 482, a sealing member 465, and a distal layer 483. The transition layer 482 abuts against the distal end of the lens 491 and has a height (in this case, from the bottom of FIG. 4 to the top of FIG. 4) that is slightly less than the height of the lens 491. The distal layer 483 abuts against the distal end of the transition layer 482 and has a height that is greater than the height of the lens 491. In this way, the proximal side of the outer perimeter of the distal layer 483 abuts against the inner surface of the wall 403 of the enclosure cover 402 adjacent to the aperture in which the lens 491 is disposed.

The window 490 can be made from a single piece, as from a mold. For example, the window 490 can be a molded from a polymer into a monolithic window. When made from a single piece, the various layers (e.g., transition layer 482, distal layer 483) of the window 490 described above can be undercuts and overhangs. Alternatively, the window 490 can be made from multiple pieces that are coupled (e.g., using epoxy, fused) to each other. These various layers are optional features of a window 490. In this case, the optional sealing member 465 (e.g., a gasket, an o-ring, silicone) is disposed between the lens 491, the transition layer 482, and the distal layer 483. The sealing member 465 helps provide an environmental seal, as can be required when the ambient environment 411 in which the enclosure 400 is located is a hazardous environment.

The window 490 can be coupled to the wall 403 of the enclosure cover 402 in any of a number of ways. In this case, the outer perimeter along the side of the lens 491 has mating threads 484 disposed thereon, and these mating threads 484 complement mating threads 427 disposed along the portion of the wall 403 of the enclosure cover 402 that forms the aperture in which the lens 491 is disposed. In such a case, the lens 491 is circular when viewed from outside the enclosure 400. When the enclosure 400 is an explosion-proof enclosure, a flame path 469 is formed between mating threads 427 and mating threads 484. Because of the mating thread configuration for securing the window 490 to the enclosure cover 402 in this case, use of a frame (e.g. frame 392 of FIG. 3) is optional.

The illuminated viewing system 480 of FIG. 4 also includes one or more sensors 460 that detects the presence of a user proximate to the window 490 outside the enclosure 400. The sensor 460 (sometimes called a sensor module 460 or a sensor device 460) can be any type of sensing device that measure one or more parameters. Examples of types of sensors 460 can include, but are not limited to, a passive infrared sensor, a photocell, a pressure sensor, a proximity sensor, a noise sensor, a voice detector, an ultrasound sensor, an image capture device (e.g., a camera), a RFID reader, an air flow monitor, a gas detector, a finger print reader, a retina scanning device, and a resistance temperature detector. A parameter that can be measured by a sensor 460 can include, but is not limited to, motion, sound, a voice, an identification code (for example, an employee ID number on an employee ID badge), occupancy of a space, body temperature, gesture or other motion, and a biological identifier (e.g., fingerprint, retina image).

In some cases, the parameter or parameters measured by a sensor 460 can be used to operate one or more light source assemblies 442 of the illuminated viewing system 480. For example, if a sensor 460 measures a parameter, or measures a value of a parameter that falls within a range of values, then one or more light source assemblies 442 illuminate, directing light 444 to one or more devices 410 (e.g., VFD 406, circuit breaker 429) within the cavity 407 of the enclosure 400. In this example, the devices 410 (specifically, the VFD 406 and the circuit breaker 429) are mounted on a back wall 425 of the enclosure body 424. In some cases, one or more components of an example illuminated viewing system 480 can be considered a device 410.

In certain example embodiments, optional optical device 478 can be used in conjunction with a sensor 460. In such a case, the optical device 478 can be used to control the spatial range (e.g., field of view, distance, direction) from which the sensor 460 can read in the ambient environment 411. Put another way, the optical device 478 can shape the beam or other source of energy used by the sensor 460 to measure a parameter in the ambient environment 411.

The optical device 478 can have one or more of any of a number of characteristics (e.g., concave shape, convex shape, asymmetric, symmetric, random, a Fresnel lens configuration), Further, the optical device 478 can be attached to (e.g., adhered) or integral with one or more components (e.g., sensor 460, lens 491) of the illuminated viewing system 480 (or other parts of the enclosure 400) in any of a number of ways. For example, the optical device 478 can be integral with the sensor 460. As another example, as in this case, the optical device 478 can be adhered (e.g., using epoxy) to the outer surface of the lens 491 exposed to the ambient environment.

Each sensor 460 can be coupled to, or can include, a switch 470. A switch 470 has an open state and a closed state (position). In the open state, the switch 470 creates an open circuit, which prevents the power supply 440 from delivering power to one or more of the light source assemblies 442. In the closed state, the switch 470 creates a closed circuit, which allows the power supply 440 to deliver power to one or more of the light source assemblies 442. In certain example embodiments, the position of each switch 470 is controlled by and/or based on input from a sensor 460. Each switch 470 can be any type of device that changes state or position (e.g., opens, closes) based on certain conditions. Examples of a switch 470 can include, but are not limited to, a transistor, a dipole switch, a relay contact, a resistor, and a NOR gate.

Each switch 470 can be coupled to, or can be integrated with, a power supply 440. In certain example embodiments, the power supply 440 of the example illuminated viewing system 480 receives power (e.g., primary power, secondary power) from an external source (e.g., a wall outlet, an energy storage device, a power source within the cavity 407 of the enclosure 400). The power supply 440 uses the power it receives to generate and provide power (called also final power herein) to one or more of the light source assemblies 442. The power supply 440 can also provide power to one or more other components of the illuminated viewing system 480, including but not limited to a sensor 460 and a switch.

The power supply 440 can be called by any of a number of other names, including but not limited to a driver, a LED driver, and a ballast. The power supply 440 can include one or more of a number of single or multiple discrete components (e.g., transistor, diode, resistor), and/or a microprocessor. The power supply 440 may include a printed circuit board, upon which the microprocessor and/or one or more discrete components are positioned, and/or a dimmer.

The power supply 440 can include one or more components (e.g., a transformer, a diode bridge, an inverter, a converter) that receives power (for example, through an electrical cable) and generates final power of a type (e.g., alternating current, direct current) and level (e.g., 12V, 24V, 120V) that can be used by the light source assemblies 442 and/or other components of the illuminated viewing system 480. In some cases, the power supply 440 can be a source of power in itself. For example, the power supply 440 can be an energy storage device (e.g., a battery, a supercapacitor), a localized photovoltaic power system, or some other source of independent power. In certain example embodiments, a sensor 460 can include an energy storage device (e.g., a battery) that is used to provide power, at least in part, to some or all of the rest of the sensor 460.

The one or more light source assemblies 442 of the example illuminated viewing system 480 emit light when they receive the appropriate power and/or control signals from the power supply 440. A light source assembly 442 can include one or more components, including but not limited to a local control module, a light engine, a heat sink, an electrical conductor or electrical cable, a light source (e.g., a light bulb, a LED), a substrate, a terminal block, and a circuit board. A light source assembly 442 can use any of a number of lighting technologies, including but not limited to light-emitting diode (LED), incandescent, fluorescent, halogen, and sodium vapor.

In this case, the example illuminated viewing system 480 also includes an optional optical device 475. Here, the optical device 475 is disposed within the cavity 407 of the enclosure 400 and is disposed on the distal surface of the distal layer 483. Further, the optical device 475 is disposed adjacent to the light source assembly 442 and is designed to manipulate (e.g., refract, focus, direct) the light 444 emitted by the light source assembly 442 so that a user, when looking through the lens 491 of the window 490, can better view the devices 410 within the cavity 407 of the enclosure 400. The presence of one optional optical device (e.g., optional optical device 475) is independent of another optional optical device (e.g., optional optical device 478).

The sensor 460, the switch 470, the power supply 440, and the light source assembly 442 can be discrete components of the example illuminated viewing system 480, as shown in FIG. 4. Alternatively, one or more of the sensor 460, the switch 470, the power supply 440, and/or the light source assembly 442 can be combined with another component of the example illuminated viewing system 480.

A sensor 460 can be located within, in, and/or outside the enclosure 400. For example, in this case, the sensor 460 is disposed within the lens 491. Similarly, a switch 470 can be located within, in, and/or outside the enclosure 400. For example, in this case, the switch 470 is disposed within the lens 491, adjacent to the sensor 460. Further, the power supply 440 can be located within, in, and/or outside the enclosure 400. For example, in this case, the power supply 440 is disposed within the lens 491, adjacent to the switch 470. In addition, one or more of the light source assemblies 442 can be located within and/or in, the enclosure 400. For example, in this case, the light source assembly 442 is disposed within the lens 491, adjacent to the power supply 440.

When the enclosure 400 is located in a hazardous environment, the sensor 460 and/or other components of the example illuminated viewing system 480 can be intrinsically safe. As used herein, the term "intrinsically safe" refers to a device (e.g., a sensor 460 described herein) that is placed in a hazardous environment. To be intrinsically safe, the component of the example illuminated viewing system 480 uses a limited amount of electrical energy so that sparks cannot occur from a short circuit or failures that can cause an explosive atmosphere found in hazardous environments to ignite. A safety barrier is commonly used with an intrinsically safe device, where the safety barrier limits the amount of power delivered to the sensor or other component of the example illuminated viewing system 480 to reduce the risk of explosion, fire, or other adverse condition or event that can be caused by high amounts of power in the hazardous environment. An adverse condition or event can also be an abnormal condition that is not potentially catastrophic in nature.

Referring now to FIG. 5, the enclosure 500 of FIG. 5 is substantially the same as the enclosure 400 of FIG. 4, except as described below. For example, the enclosure 500 of FIG. 5 includes an enclosure body 524 coupled to an enclosure cover 502 and is located in an ambient environment 511. A window 590 of an illuminated viewing system 580 is disposed in a wall 503 of the enclosure cover 502. Specifically, mating threads 584 disposed on the outer surface of the lens 591 of the window 590 couple to mating threads 527 that form an aperture in the wall 503 of the enclosure cover 502, forming a flame path 569 between the enclosure cover 502 and the window 590. Also, the window 590 includes a lens 591, a transition layer 582, a sealing member, and a distal layer 583.

In this case, there is no optical device (e.g., optical device 475) adjacent to the light source assembly 542. Instead, there is a different optical device 577 disposed within the cavity 507 of the enclosure 500 and disposed on the distal surface of the distal layer 583 of the window 590. Further, the optical device 575 covers most, if not all, of the height of the lens 591 and is designed to manipulate (e.g., focus, redirect) the view of a user when looking through the lens 591 of the window 590. In this way, the user can better view the devices 510 (in this case, a VFD 506 and a circuit breaker 529) disposed within the cavity 507 of the enclosure 500 when the light 544 emitted by the light source assembly 542 is directed to the devices 510 within the cavity 507 of the enclosure 500. In this case, the VFD 506 and the circuit breaker 529 are mounted on a back wall 525 of the enclosure body 524.

Further, the switch 570, the power supply 540, and the light source assembly 542 are disposed within the cavity 507 of the enclosure 500 rather than disposed within the lens 591 of the window 590. The sensor 560, which is still disposed within the lens 591 of the window 590, is coupled to the switch 570, the power supply 540, and the light source assembly 542 using one or more electrical conductors 509. Alternatively, the sensor 560 can be coupled to the switch 570, the power supply 540, and/or the light source assembly 542 wirelessly, such as through the use of inductive power transfer.

Referring now to FIG. 6, the enclosure 600 of FIG. 6 is substantially the same as the enclosure 400 of FIG. 4 or the enclosure 500 of FIG. 5, except as described below. For example, the enclosure 600 of FIG. 6 includes an enclosure body 624 and is located in an ambient environment 611. While the devices 610 disposed within the cavity 607 of the enclosure 600 are a VFD 606 and a circuit breaker 629, in this case the VFD 606 and the circuit breaker 629 are mounted on a side wall 625 of the enclosure body 624.

In this case, the window 690 is disposed in an aperture in a wall 625 of the enclosure body 624 (rather than the enclosure cover) that opposed the wall 625 on which the devices 610 are disposed. Mating threads 684 disposed on the outer surface of the lens 691 of the window 690 couple to mating threads 627 that form an aperture in the wall 625 of the enclosure body 624, forming a flame path 669 between the enclosure body 624 and the window 690. Also, the window 690 includes a lens 691, a transition layer 682, a sealing member, and a distal layer 683. Also, in this example, there is no optical device (e.g., optical device 475, optical device 577) in the example illuminated viewing system 680. Further, the sensor 660, the switch 670, the power supply 640, and the light source assembly 642 are all disposed within the cavity 607 of the enclosure 600. In other words, none of these components of the illuminated viewing system 680 are disposed within the lens 691 of the window 690. The light 644 emitted by the light source assembly 642 is directed toward the VFD 606 and the circuit breaker 629 are mounted on the opposing side wall 625 of the enclosure body 624.

Further, in this case, the sensor 660, the switch 670, the power supply 640, and the light source assembly 642 are all clustered relatively close together. The sensor 660 of the example illuminated viewing system 680 of FIG. 6 is disposed on the distal surface of the distal layer 683 of the window 690 within view of the lens 681. The power supply 640, which in this case is coupled to the sensor 660 and the light source assembly 642 using one or more electrical conductors 609, is disposed against the inner surface of a wall 625 of the enclosure body 624, adjacent to where the window 690 is disposed. The switch 670 is integrated with the power supply 640 in this example. In addition, the light source assembly 642 is disposed on the distal surface of the distal layer 683 of the window 690, outside of the view of the lens 681.

Referring now to FIG. 7, the enclosure 700 of FIG. 7 is substantially the same as the enclosure 400 of FIG. 4, the enclosure 500 of FIG. 5, or the enclosure 600 of FIG. 6, except as described below. For example, the enclosure 700 of FIG. 7 includes an enclosure body 724 coupled to an enclosure cover 702 and is located in an ambient environment 711. A window 790 of an illuminated viewing system 780 is disposed in a wall 703 of the enclosure cover 702. Specifically, mating threads 784 disposed on the outer surface of the lens 791 of the window 790 couple to mating threads 727 that form an aperture in the wall 703 of the enclosure cover 702, forming a flame path 769 between the enclosure cover 702 and the window 790. Also, the window 790 includes a lens 791, a transition layer 782, a sealing member 765, and a distal layer 783.

The devices 710 (in this example, a VFD 706 and a circuit breaker 729) are mounted on a back wall 725 of the enclosure body 724. In this case, there is no optical device (e.g., optical device 475, optical device 577) in the example illuminated viewing system 780. Further, the sensor 760 of FIG. 7 is disposed partly in the wall 703 of the enclosure cover 702 and partially exposed to the ambient environment 711. The power supply 740 (which has the switch 770 integrated therewithin) and the light source assembly 742 are coupled to each other and are disposed on the inner surface of the wall 703 adjacent to the window 790. The light source assembly 742, when illuminated, emits light 744 within the cavity 707 of the enclosure 700 toward the devices 710 disposed on the opposing back wall 725 of the enclosure body 724.

The sensor 760 of the example illuminated viewing system 780 of FIG. 7 can be wirelessly coupled to the combination power supply 740 and switch 770. For example, the sensor 760 can include a magnet that allows the sensor 760 to be magnetically coupled to the combination power supply 740 and switch 770. In this way, if the enclosure 700 is located in a hazardous environment, the wireless coupling between the sensor 760 and the combination power supply 740 and switch 770 can eliminate another penetration through the wall 703 of the enclosure cover 702, thereby eliminating a flame path (e.g., flame path 769) that must be maintained.

Referring now to FIG. 8, the enclosure 800 of FIG. 8 is substantially the same as the enclosure 400 of FIG. 4, the enclosure 500 of FIG. 5, the enclosure 600 of FIG. 6, or the enclosure 700 of FIG. 7, except as described below. In this example, the enclosure cover is removed, exposing the contents (e.g., devices 810 such as a terminal block, a circuit breaker, a relay, a sensor) within the enclosure body 824. As such, the coupling features 820 (in this case, apertures) disposed around and that traverse the enclosure engagement surface 808 are visible. The enclosure 800 is located in an ambient environment 811.

In this case, there is no optical device (e.g., optical device 475, optical device 577) in the example illuminated viewing system 880. Further, this example illuminated viewing system 880 includes two windows 890. Window 890-1 is disposed in the right side wall 825 of the enclosure body 824, and window 890-2 is disposed in the left side wall 825 of the enclosure body 824.

There are also two sensors 860 in the example illuminated viewing system 880 of FIG. 8. Sensor 860-1 is disposed within the lens 891-1 of window 890-1, and sensor 860-2 is disposed within the lens 891-2 of window 890-2. The power supply 840 and the switch 870 are combined into a single component and is disposed along the back wall 825 of the enclosure body 824. The light source assembly 842 is disposed on the inner surface of the top wall 825 of the enclosure body 824.

In some cases, these light source assemblies described herein can be "driverless", meaning that they may not require a separate power source. In such a case, the power requirements of the light source assemblies would be low. For example, a light source assembly could be powered by a battery or other energy storage device. This would be possible because the duration of illumination of a light source assembly would be relatively short (e.g., for as long as a user needs to perform a visual inspection of the devices within the enclosure), often on the order of 5-10 seconds. The short duration of illumination allows for high power density due to the large thermal mass of the enclosure, since the enclosure is often made of thermally conductive material. In addition, the light emitted by the light source assemblies in example embodiments is sufficiently strong, despite being low profile, capable of sufficient lumens (e.g., 100-500) per square inch of mounting surface.

Figure 9:
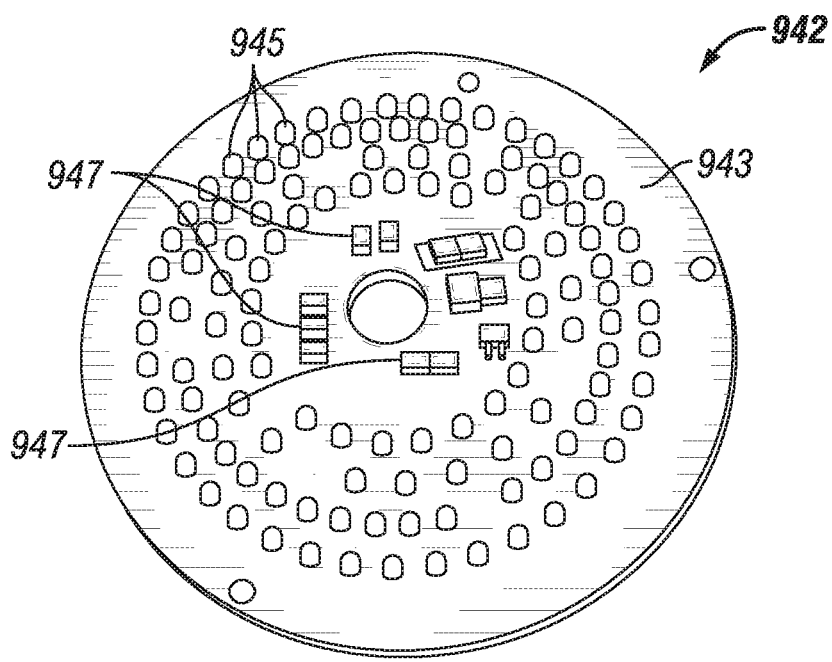
FIGS. 9-11 show various light source assemblies in accordance with certain example embodiments.
Figure 10:
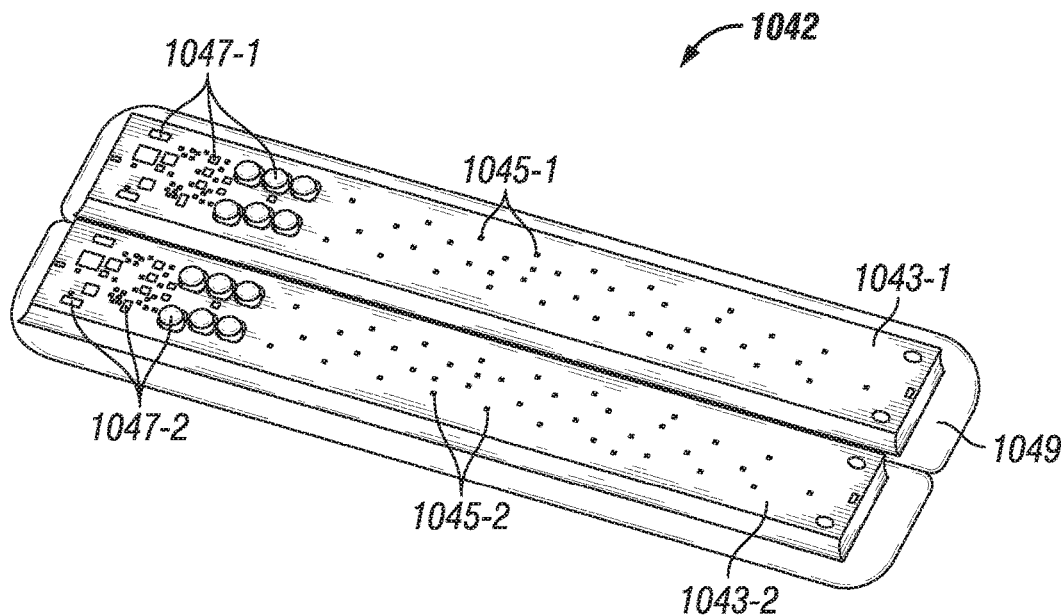
Figure 11:
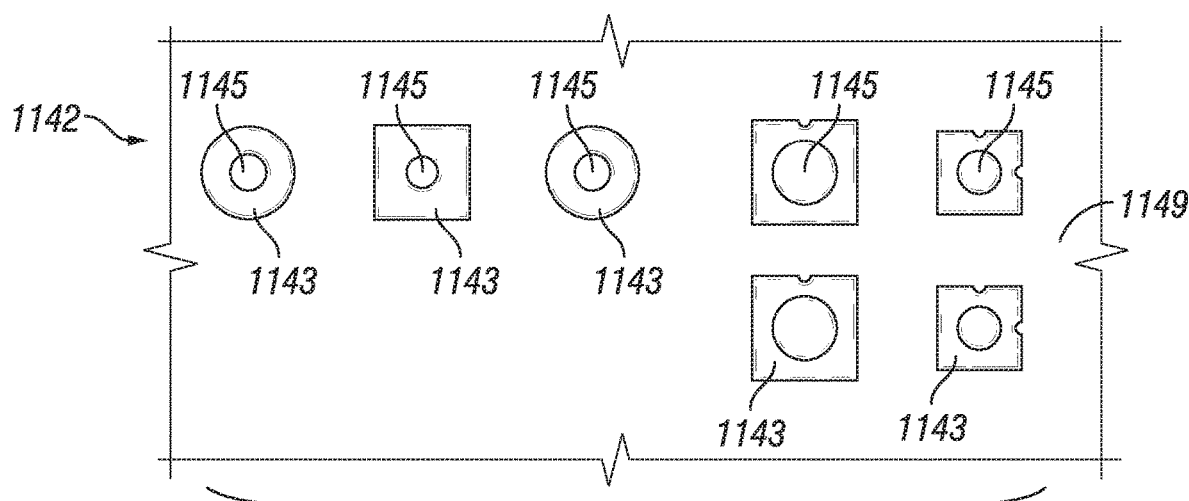

FIGS. 9-11 show various light source assemblies in accordance with certain example embodiments. Specifically, FIG. 9 shows light source assembly 942, FIG. 10 shows light source assembly 1042, and FIG. 11 shows light source assembly 1142. Referring to FIGS. 1-11, the light source assembly 942 of FIG. 9 includes a circular circuit board 943, a number of light sources 945 (e.g., LEDs) disposed around the top surface of the circuit board 943, and a number of discrete components 947 (e.g., resistors, capacitors) disposed on the top surface toward the center of the circuit board 943 adjacent to the light sources 945.

The light source assembly 1042 of FIG. 10 includes a pair of rectangular-shaped circuit boards 1043 (circuit board 1043-1 and circuit board 1043-2) aligned next to each other and disposed on a mounting plate 1049. Each circuit board 1043 includes a number of light sources 1045 (light sources 1045-1 for circuit board 1043-1 and light sources 1045-2 for circuit board 1043-2) disposed on the top surface of the respective circuit board 1043, and a number of discrete components 1047 (discrete components 1047-1 for circuit board 1043-1 and discrete components 1047-2 for circuit board 1043-2) disposed on the top surface at the left end of the circuit board 1043 adjacent to the light sources 1045.

The light source assembly 1142 of FIG. 11 includes a number of small square circuit boards 1143 disposed on a mounting plate 1149, and a light source 1145 disposed on the top surface of most of the circuit boards 1143. Some of the circuit boards 1143 have no light source 1145, but are capable of receiving a light source 1145. In some cases, there is only a single circuit board 1143 with a single light source 1145 mounted the mounting plate 1149.

Example embodiments allow a user to visually inspect one or more devices within an enclosure without opening the enclosure. Example embodiments include at least one light source that directs light toward components (e.g., devices) located within the cavity of the enclosure, where the enclosure includes a window disposed in a wall or cover of the enclosure. The light source illuminates under certain conditions, such as the detection of a person near the window of the enclosure. Example embodiments can also be used in specific environments (e.g., hazardous environments) so that the enclosure maintains compliance with any applicable standards for that environment.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. An enclosure disposed in an ambient environment, the enclosure comprising:
   a cover;
   a body detachably coupled to the cover, wherein the body comprises at least one wall that forms a cavity that is enclosed by the cover when the cover is coupled to the body;
   at least one electrical device disposed within the cavity; and
   at least one illuminated viewing system disposed in an aperture that traverses the cover or in the at least one wall, wherein the at least one illuminated viewing system comprises:
      a window disposed in the cover or in the at least one wall, wherein the window is made of a molded polymer and comprises a first layer and a second layer, wherein the first layer is disposed within the aperture, and wherein a portion of the second layer abuts against an inner surface of the cover or the at least one wall; and
      at least one light source assembly that directs light within the cavity in which the at least one electrical device is disposed,
   wherein the ambient environment is a hazardous environment,
   wherein the window and either the cover or the at least one wall form a first flame path therebetween, wherein the first flame path is configured to quench an explosion that originates inside the enclosure, and wherein the first flame path also is configured to allow gases from inside the enclosure to escape and cool as the gases exit the enclosure,
   wherein the cover and the body form a second flame path therebetween, wherein the second flame path is configured to quench the explosion that originates inside the enclosure, and wherein the second flame path also is configured to allow the gases from inside the enclosure to escape and cool as the gases exit the enclosure.

2. The enclosure of claim 1, wherein the at least one light source assembly is disposed within the window.

3. The enclosure of claim 1, wherein the at least one light source assembly is disposed within the cavity adjacent to the window.

4. The enclosure of claim 1, wherein the illuminated viewing system further comprises:

a switch coupled to the at least one light source assembly, wherein the at least one light source assembly illuminates when the switch operates.

5. The enclosure of claim 4, wherein the illuminated viewing system further comprises:
a sensor coupled to the switch, wherein the sensor measures at least one parameter associated with a presence of a user proximate to the window, wherein the sensor operates the switch when the sensor detects the presence of the user.

6. The enclosure of claim 5, wherein the sensor is disposed on an outer surface of the at least one wall.

7. The enclosure of claim 5, wherein the sensor is disposed within the window.

8. The enclosure of claim 5, wherein the sensor is disposed within the cavity.

9. The enclosure of claim 5, wherein the illuminated viewing system further comprises:
an optical device disposed adjacent to the sensor, wherein the optical device controls a spatial range in the ambient environment from which the sensor measures the at least one parameter.

10. The enclosure of claim 1, wherein the at least one light source assembly illuminates using power supplied by a power source.

11. The enclosure of claim 10, wherein the power source comprises an energy storage device.

12. The enclosure of claim 11, wherein the energy storage device is disposed within the window.

13. The enclosure of claim 1, wherein the at least one light source assembly comprises a first light source assembly, wherein the first light source assembly directs first light toward a first location within the cavity, wherein at least one device is disposed in the first location.

14. The enclosure of claim 13, wherein the at least one light source assembly further comprises a second light source assembly, wherein the second light source assembly directs second light toward a second location within the cavity.

15. The enclosure of claim 1, wherein the illuminated viewing system further comprises:
an optical device disposed adjacent to the window within the cavity, wherein the optical device manipulates a view of a user looking through the window at the at least one location within the cavity.

16. The enclosure of claim 1, wherein the illuminated viewing system further comprises:
an optical device disposed adjacent to the at least one light source assembly, wherein the optical device manipulates light emitted by the at least one light source assembly toward the at least one location within the cavity.

17. The enclosure of claim 1, wherein the light directed toward the at least one location within the cavity illuminates a presence of an adverse condition at the at least one location within the cavity, wherein the adverse condition comprises at least one selected from a group consisting of corrosion, a blown fuse, improper mechanical operation of a switch, improper movement of a contactor, mechanical damage, thermal damage, and moisture accumulation.

18. The enclosure of claim 1, wherein the at least one light source, when illuminated, avoids causing an explosion within the cavity.

19. An enclosure disposed in an ambient environment, the enclosure comprising:
at least one wall that forms a cavity;
at least one electrical device disposed within the cavity; and
at least one illuminated viewing system disposed in the at least one wall, wherein the at least one illuminated viewing system comprises:
a window disposed in the at least one wall, wherein the window is made of a molded polymer; and
a sensor disposed within the molded polymer of the window, wherein the sensor is configured to measure at least one parameter associated with a presence of a user proximate to the window, wherein the sensor operates a switch when the sensor detects the presence of the user, wherein the switch, when operated, provides power to at least one light source to illuminate at least part of the cavity.

* * * * *